(12) United States Patent
Saito

(10) Patent No.: US 6,376,847 B1
(45) Date of Patent: Apr. 23, 2002

(54) CHARGED PARTICLE LITHOGRAPHY METHOD AND SYSTEM

(75) Inventor: Takashi Saito, Osaka (JP)

(73) Assignee: Matsushia Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/366,734

(22) Filed: Aug. 4, 1999

(30) Foreign Application Priority Data

Aug. 24, 1998 (JP) .......................................... 10-237092

(51) Int. Cl.⁷ ................................................ H01J 37/30
(52) U.S. Cl. ............................. 250/492.22; 250/492.23
(58) Field of Search ...................... 250/492.22, 492.23, 250/398

(56) References Cited

U.S. PATENT DOCUMENTS

| | | | |
|---|---|---|---|
| 5,079,112 A | 1/1992 | Berger et al. | |
| 5,130,213 A | 7/1992 | Berger et al. | |
| 5,563,419 A | * 10/1996 | Tamura | 250/492.22 |
| 6,049,085 A | * 4/2000 | Ema | 250/492.23 |
| 6,093,932 A | * 7/2000 | Nakajima | 250/492.22 |
| 6,211,528 B1 | * 4/2001 | Tamura | 250/492.22 |
| 6,235,450 B1 | * 5/2001 | Nakasuji et al. | 430/296 |

FOREIGN PATENT DOCUMENTS

| | | |
|---|---|---|
| JP | 61-283121 | 12/1986 |
| JP | 2-229423 | 9/1990 |
| JP | 9-27266 | 1/1997 |
| JP | 9-074064 | 3/1997 |
| JP | 10-135102 | 5/1998 |
| JP | 11-307445 | 11/1999 |

OTHER PUBLICATIONS

S.T. Stanton et al., "Critical dimension control at stitched sub–field boundaries in a high–throughput SCALPEL system", Proceedings of The 42$^{nd}$International Conference on Electron, Ion and Photon Beam Technology and Nanofabrication, 3 sheets, May 26–29, 1998.

* cited by examiner

Primary Examiner—Bruce Anderson
(74) Attorney, Agent, or Firm—Eric J. Robinson; Nixon Peabody LLP

(57) ABSTRACT

With a substrate stage and a mask stage continuously moved in the −Y direction, a circuit pattern is exposed to a shaped beam until the shaped beam reaches an upper left area from a lower left area, thereby obtaining a partial exposure area. Then, after the shaped beam reaches the upper left area of the circuit pattern, the substrate stage and the mask stage are shifted in the −X direction by a pitch P. Next, the substrate stage and the mask stage are continuously moved in the +Y direction until the shaped beam reaches a lower end portion from an upper end portion of the circuit pattern. In this case, the shaped beam is shaped so that an exposure dose in a double exposure portion and an exposure dose in a non-double exposure portion in the partial exposure area can be equal to each other.

17 Claims, 20 Drawing Sheets

105A

105B

105C

US 6,376,847 B1

CHARGED PARTICLE LITHOGRAPHY METHOD AND SYSTEM

BACKGROUND OF THE INVENTION

The present invention relates to charged particle lithography method and system for writing a design pattern formed on a mask onto a substrate by using charged particles in fabrication of a semiconductor device, a liquid crystal display device or a thin film magnetic head device.

In photolithography now used in fabrication of a semiconductor device and the like, a KrF excimer laser beam with a wavelength of 248 nm is used as a light source. Furthermore, lithography using an ArF excimer laser beam with a wavelength of 193 nm is planned to be adopted as the next generation photolithography. However, for further refinement of devices, there is a limit in the resolution between design patterns attained by the photolithography.

Therefore, various types of lithography techniques have been proposed, among which lithography technique using charged particles, such as ions and electrons, particularly an electron beam, is regarded promising. The electron beam lithography method is divided into a method using a mask bearing a design pattern and a method not using a mask.

Now, a conventional electron beam lithography method using a mask will be roughly described with reference to drawings. FIG. 19 is a diagram for illustrating the conventional electron beam lithography method in which an electron beam 103 is scanned across a mask 101 bearing a desired circuit pattern 102. As is shown in FIG. 19, an electron beam emitted from an electron gun is allowed to pass through a shaping aperture (not shown) to be shaped into an electron beam with a section of, for example, approximately 1 mm×1 mm, and the mask 101 bearing the desired circuit pattern 102 is exposed to the shaped electron beam. The electron beam having passed through the mask 101 is reduced by an electron lens, and exposes a substrate (not shown) coated with a resist. In general, the circuit pattern 102 is sufficiently larger than the dimension of the shaping aperture. Accordingly, as is shown in FIG. 19, by repeating scanning of the circuit pattern 102 from one end to the other end thereof with the mask 101 continuously moved by using the effective width of the shaping aperture as a pitch P, the entire circuit pattern 102 is exposed zonally to the electron beam 103.

The conventional electron beam lithography method, however, has the following problem: As is shown in FIG. 20, during the repeated scanning of the electron beam 103, there arises a connection error between partial exposure areas 104A, 104B and 104C, each of which corresponds to an area exposed in one of the repeated scanning. In the case shown in FIG. 20, the first partial exposure area 104A and the second partial exposure area 104B are away from each other and the second exposure area 104B and the third exposure area 104C overlap each other. This problem occurs depending upon alignment accuracy of a stage for supporting the substrate or the mask and stability of the used electron beam.

The connection error caused between the partial exposure areas leads to the following problems in wiring a pattern across the connection between the partial exposure areas: When the partial exposure areas are away from each other, disconnection is caused as is shown in FIG. 21(a), and when the distance therebetween is small, a line width failure where the line width is locally reduced is caused as is shown in FIG. 21(b), and hence there is fear of disconnection. Furthermore, when the partial exposure areas overlap each other, a line width failure where the line width is locally increased is caused as is shown in FIG. 21(c). In any case, a failure can be caused in the resultant circuit pattern.

SUMMARY OF THE INVENTION

In view of the aforementioned conventional problems, an object of the invention is preventing fatal deformation of a circuit pattern without lowering throughput even when there arises a connection error between partial exposure areas.

In order to achieve the object, according to the invention, respective exposure areas are exposed to be partially overlapped in repeating partial transfer of a design pattern formed on a mask, so that an exposure dose in a double exposure portion and an exposure dose in a normal exposure portion that is not doubly exposed can be equal to each other.

Specifically, the charged particle lithography method of this invention comprises a beam shaping step of shaping an output beam emitted from a charged particle producing source into a predetermined shape; and a design pattern transferring step of transferring a design pattern formed on a mask onto a substrate by repeating partial transfer for transferring a part of the design pattern onto the substrate by allowing the shaped beam to transmit the part of the design pattern and exposing a part of the substrate to the transmitted beam, wherein the design pattern transferring step includes, in conducting the partial transfer, a step of forming a double exposure portion that is doubly exposed in an exposure area on the substrate exposed to the beam, and exposing the exposure area so that an exposure dose in the double exposure portion and an exposure dose in a non-double exposure portion that is not doubly exposed are substantially the same.

In the charged particle lithography method of this invention, a double exposure portion that is doubly exposed in repeated partial transfer is formed in an exposure area on the substrate. Therefore, a margin for moving the beam can be so large that exposure areas are difficult to be away from each other. Also, the exposure is conducted so as to attain substantially the same exposure dose in the double exposure portion and the non-double exposure portion that is not doubly exposed in the exposure area. Therefore, a line width failure can be prevented from being caused in a design pattern in the double exposure portion. Furthermore, even when the exposure areas are away from each other, the exposure dose is prevented from being 0, and even when the exposure areas are largely overlapped, the exposure dose is not doubled. Accordingly, disconnection and deformation of a resist pattern derived from a connection error occurring in repeating the partial exposure can be prevented, resulting in improving the performance and the yield of semiconductor devices.

In the charged particle lithography method, the beam shaping step preferably includes a step of shaping the output beam so that an exposure dose of the output beam at a center of a line extending between an end of the double exposure portion closer to the non-double exposure portion and the other end of the double exposure portion farther from the non-double exposure portion is approximately a half of an exposure dose in the non-double exposure portion, and the design pattern transferring step preferably includes a step of scanning the shaped beam across the mask and the substrate zonally. In this manner, even when the exposure is conducted by the scanning method, the exposure dose in the double exposure portion can be substantially the same as the exposure dose in the non-double exposure portion.

In the charged particle lithography method, the beam shaping step preferably includes a step of continuously changing the output beam so that an exposure dose of the output beam in the double exposure portion is 0 at an end thereof farther from the non-double exposure portion and is a predetermined dose at the other end closer to the non-double exposure portion, and the design pattern transferring step preferably includes a step of scanning the shaped beam across the mask and the substrate zonally. In this manner, even when the exposure is conducted by the scanning method, the exposure dose in the double exposure portion can be substantially the same as the exposure dose in the non-double exposure portion.

In the charged particle lithography method, the beam shaping step preferably includes a step of shaping the output beam so that an exposure dose of the output beam in the double exposure portion is approximately a half of an exposure dose in the non-double exposure portion, and the design pattern transferring step preferably includes a step of exposing the mask and the part of the substrate to the shaped beam with the shaped beam stopped, and moving the shaped beam so as to doubly expose an end portion of the exposure area toward a direction of moving the shaped beam. In this manner, even when the exposure is conducted by a step-and-repeat exposure method, the exposure dose in the double exposure portion can be substantially the same as the exposure dose in the non-double exposure portion.

In adopting the step-and-repeat exposure method, the beam shaping step preferably includes a step of shaping the output beam so that an exposure dose of the output beam in the double exposure portion at each of four corners in the exposure area is approximately ¼ of an exposure dose in the non-double exposure portion. In this manner, even when the exposure is conducted by the step-and-repeat exposure method in which the double exposure portions at four corners of the exposure area are exposed four times, the exposure dose in each double exposure portion can be substantially the same as the exposure dose in the non-double exposure portion.

In the charged particle lithography method, the double exposure portion preferably has a width smaller than approximately one-hundredth of a distance to move the exposure area in repeating the partial transfer. In this manner, the throughput can be prevented from lowering.

In the charged particle lithography method, the double exposure portion preferably has a width smaller than approximately one-hundredth of a width of the exposure area. In this manner, the throughput can be prevented from lowering.

The first charged particle lithography system of this invention for writing a design pattern formed on a mask onto a substrate by repeating exposure of a part of the design pattern to a beam of charged particles with the part of the design pattern partially overlapped in each exposure, comprises charged particle producing means for emitting the beam to the substrate; substrate supporting means for supporting the substrate; mask supporting means for supporting the mask between the charged particle producing means and the substrate; a shaping aperture for shaping the beam into a predetermined shape disposed between the charged particle producing means and the mask supported by the mask supporting means; and moving means for moving the mask supporting means and the substrate supporting means relatively to the charged particle producing means, wherein the shaping aperture has an aperture pattern for attaining substantially the same exposure dose in a double exposure portion that is doubly exposed and in a non-double exposure portion that is not doubly exposed, the double exposure portion and the non-double exposure portion being formed in an exposure area on the substrate exposed to the beam having passed through the mask.

In the first charged particle lithography system, a double exposure portion that is doubly exposed is formed in an exposure area on the substrate exposed to the beam having passed through the mask. Therefore, a margin for moving the beam is so large that the exposure areas are difficult to be away from each other. Furthermore, since the shaping aperture has the aperture pattern for attaining substantially the same exposure dose in the double exposure portion and the non-double exposure portion that is not doubly exposed in the exposure area. Therefore, a line width failure can be prevented from being caused in a design pattern in the double exposure portion. In addition, even when the exposure areas are away from each other, the exposure dose is prevented from being 0, and even when the exposure areas are largely overlapped each other, the exposure dose is not doubled. Accordingly, disconnection and deformation of a resist pattern derived from a connection error occurring in repeating the partial transfer can be prevented, resulting in improving the performance and the yield of semiconductor devices.

In the first charged particle lithography system, an area of the aperture pattern corresponding to the double exposure portion preferably has an aperture ratio of substantially 50% and an area of the aperture pattern corresponding to the non-double exposure portion has an aperture ratio of substantially 100%. In this manner, the exposure dose in the double exposure portion can be substantially the same as the exposure dose in the non-double exposure portion in the exposure area.

In this case, the aperture pattern is preferably in the shape of a parallelogram having, as opposing oblique sides, sides of the area of the aperture pattern corresponding to the double exposure portion. Thus, the exposure dose in the double exposure portion can be substantially the same as the exposure dose in the non-double exposure portion in the exposure area.

Alternatively, the aperture pattern is preferably in the shape of a trapezoid having, as opposing oblique sides, sides of the area of the aperture pattern corresponding to the double exposure portion. Thus, the exposure dose in the double exposure portion can be substantially the same as the exposure dose in the non-double exposure portion in the exposure area.

In the first charged particle lithography system, the area of the aperture pattern corresponding to the double exposure portion preferably has transmittance of substantially 50% and the area of the aperture pattern corresponding to the non-double exposure portion preferably has transmittance of substantially 100%. In this manner, the exposure dose in the double exposure portion can be substantially the same as the exposure dose in the non-double exposure portion in the exposure area.

The second charged particle lithography system of this invention for writing a design pattern formed on a mask onto a substrate by repeating exposure of a part of the design pattern to a beam of charged particles with the part of the design pattern partially overlapped in each exposure, comprises charged particle producing means for emitting the beam to the substrate; substrate supporting means for supporting the substrate; mask supporting means for supporting the mask between the charged particle producing means and the substrate; and moving means for moving the mask supporting means and the substrate supporting means relatively to the charged particle producing means, wherein the charged particle producing means includes plural charged particle sources arranged for attaining substantially the same exposure dose in a double exposure portion that is doubly exposed and in a non-double exposure portion that is not doubly exposed, the double exposure portion and the non-double exposure portion being formed in an exposure area on the substrate exposed to the beam having passed through the mask.

In the second charged particle lithography system, a double exposure portion that is doubly exposed is formed in an exposure area on the substrate exposed to the beam having passed through the mask. Therefore, a margin for moving the beam is so large that the exposure areas are difficult to be away from each other. Furthermore, since the charged particle producing means includes the plural charged particle sources arranged so that the exposure dose can be substantially the same in the double exposure portion and the non-double exposure portion that is not doubly exposed in the exposure area. Therefore, a line width failure can be prevented from being caused in a design pattern in the double exposure portion. In addition, even when the exposure areas are away from each other, the exposure dose is prevented from being 0, and even when the exposure areas are largely overlapped each other, the exposure dose is not doubled. Accordingly, disconnection and deformation of a resist pattern derived from a connection error occurring in repeating the partial transfer can be prevented, resulting in improving the performance and the yield of semiconductor devices.

In the second charged particle lithography system, charged particle sources arranged in an area corresponding to the double exposure portion in the charged particle producing means preferably have a charged particle emission energy of substantially 50% of a charged particle emission energy of charged particle sources arranged in an area corresponding to the non-double exposure portion. In this manner, the exposure dose in the double exposure portion can be substantially the same as the exposure dose in the non-double exposure portion in the exposure area.

In the second charged particle lithography system, the number of charged particle sources arranged in a direction of moving the beam in an area corresponding to the double exposure portion in the charged particle producing means is preferably substantially a half of the number of charged particle sources arranged in an area corresponding to the non-double exposure portion. In this manner, the exposure dose in the double exposure portion can be substantially the same as the exposure dose in the non-double exposure portion in the exposure area.

In the first or second charged particle lithography system, the mask supporting means is preferably a mask stage and the substrate supporting means is preferably a substrate stage, and the moving means preferably moves the mask stage and the substrate stage in synchronization with each other. In this manner, for moving the mask and the substrate relatively to the charged particle beam for exposure, the movement is made easier and the range of the movement is wider by moving the stages than by moving the charged particle beam. Accordingly, the design pattern on the mask can be definitely transferred onto the substrate.

DETAILED DESCRIPTION OF THE INVENTION

Embodiment 1

Now, Embodiment 1 of the invention will be described with reference to the accompanying drawings.

Figure 1:
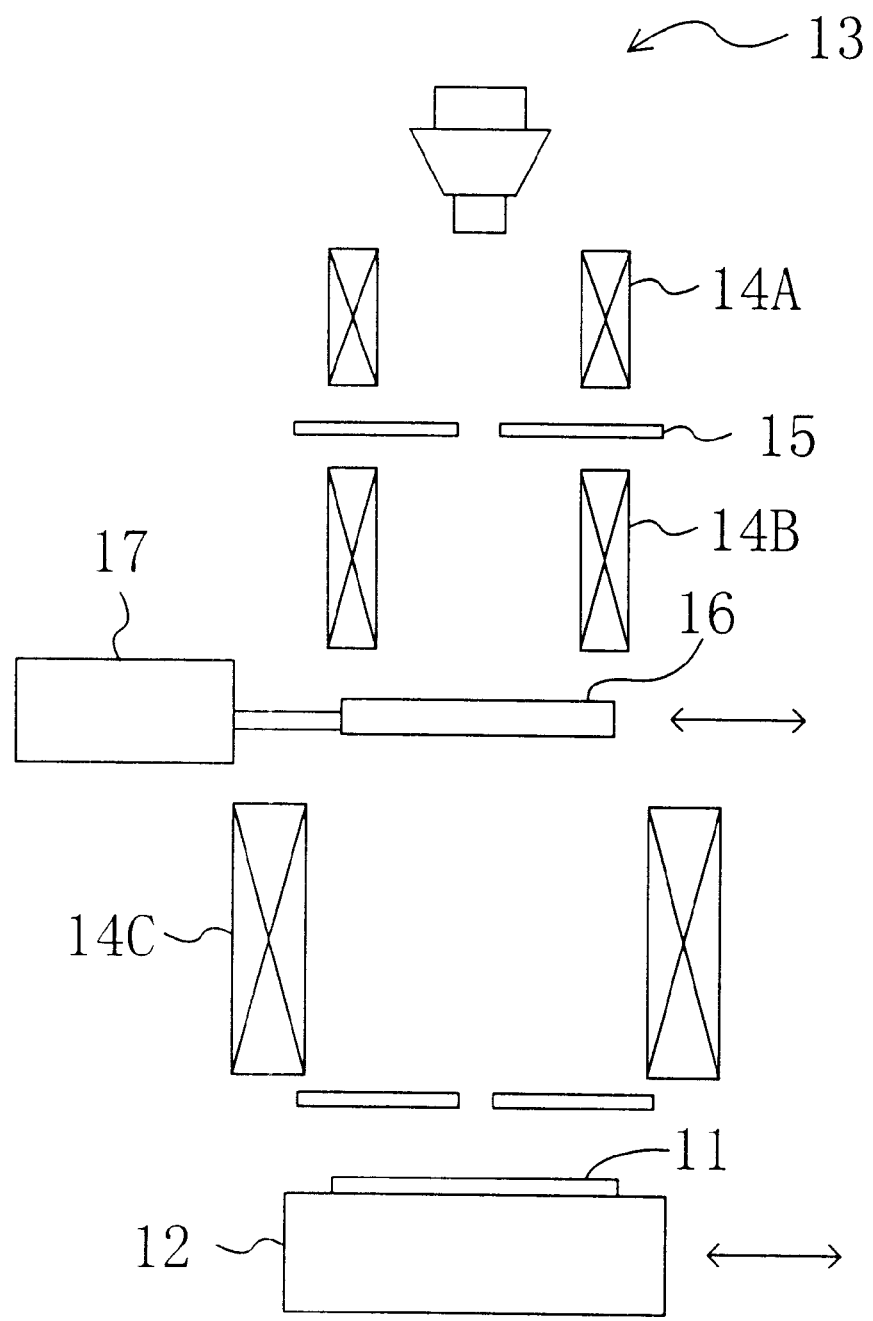
FIG. 1 is a schematic front view of a charged particle lithography system according to Embodiment 1 of the invention.

FIG. 1 is a schematic front view of a charged particle lithography system according to Embodiment 1 of the invention. As is shown in FIG. 1, a semiconductor substrate 11 whose top surface is coated with a resist film is placed on a movable substrate stage 12, and above the substrate stage 12 is disposed an electron gun 13, that is, charged particle producing means, for emitting an electron beam toward the top surface of the semiconductor substrate 11. Between the electron gun 13 and the substrate stage 12, a first deflection lens 14A, a shaping aperture 15 for shaping an electron beam emitted and accelerated by the electron gun 13, a second deflection lens 14B, a mask 16 on which a circuit pattern corresponding to design data is formed, and a deflection reducing lens 14C are disposed in this order in the downward direction. In this charged particle lithography system, the electron gun 13 is fixedly installed, and the mask 16 is connected with a mask stage 17 movable in synchronization with the substrate stage 12.

Figure 2:
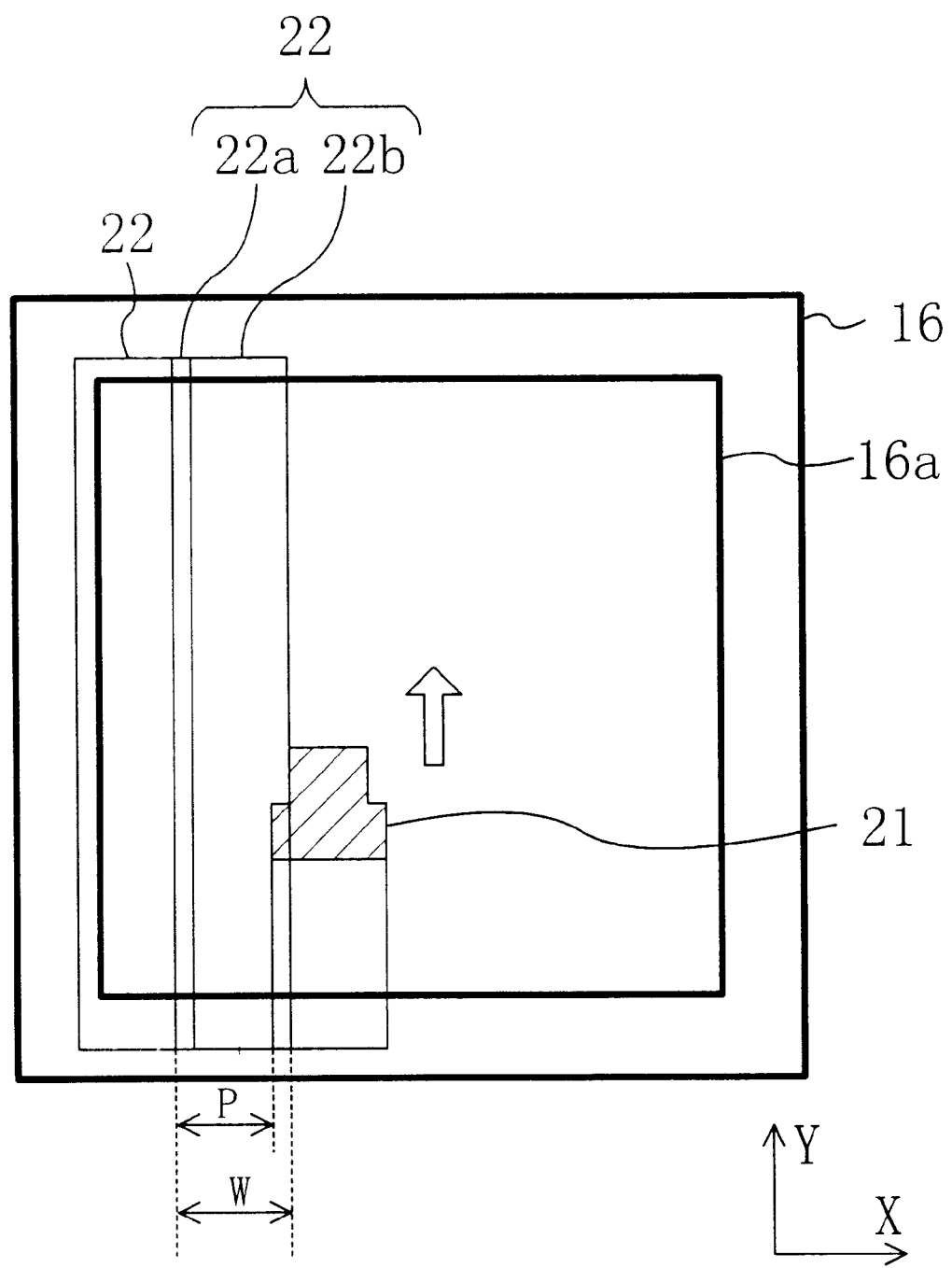
FIG. 2 is a plan view of a mask for illustrating lithography using the mask conducted by the charged particle lithography system of Embodiment 1.

FIG. 2 shows scanning of a shaped beam 21 shaped into a predetermined shape by the shaping aperture 15 across a circuit pattern 16a formed on the mask 16. As is shown in FIG. 2, the area of the circuit pattern 16a is generally sufficiently larger than the area of an aperture pattern 15a of the shaping aperture 15, and therefore, in order to write the entire circuit pattern 16a onto the semiconductor substrate 11, it is necessary to expose the entire circuit pattern 16a to the shaped beam 21. Herein, for the purpose of exposing the entire circuit pattern 16a, a scanning method in which the mask 16 is continuously moved is adopted.

Now, procedures in the scanning of the shaped beam 21 will be described.

It is herein assumed that the circuit pattern 16a on the mask 16 is written from the lower left portion thereof as is shown in FIG. 2. First, the mask stage 17 and the substrate stage 12 are moved so that an area at the lower left corner of the circuit pattern 16a to be written can correspond to an area exposed to the electron beam having passed through the shaping aperture 15. Although the electron gun 13 of the lithography system, namely, the shaped beam 21, is actually fixed, FIG. shows as if the mask 16 was fixed and the shaped beam 21 was moved in the direction of an arrow for simplifying the explanation.

Next, while the substrate stage 12 and the mask stage 17 are being continuously moved in the −Y direction, the circuit pattern 16a is exposed to the shaped beam 21 until the shaped beam 21 reaches an area at the upper left corner from the area at the lower left corner. Thus, a partial exposure area 22 is obtained. In this case, the maximum width of the shaped beam 21 is indicated by W, and the movement of the shaped beam 21 for exposing a subsequent partial exposure area 22 is indicated by a pitch P.

Then, after the shaped beam 21 reaches the area at the upper left corner of the circuit pattern 16a, the substrate stage 12 and the mask stage 17 are shifted in the −X direction by a distance corresponding to the pitch P.

Next, the substrate stage 12 and the mask stage 17 are continuously moved in the +Y direction until the shaped beam 21 reaches a lower end portion from an upper end portion of the circuit pattern 16a. At this point, the circuit pattern 16a is not necessarily scanned in such a zig-zag manner but can be scanned in the same direction as in the first partial exposure area 22. It is noted that a conventional shaping aperture generally has a square aperture pattern with the maximum width W and the pitch P set to the same value.

The method of moving the substrate stage 12 and the mask stage 17 is not limited to the aforementioned method (in-phase method) where the substrate stage 12 and the mask stage 17 are moved in the same direction with the electron gun 13 fixed. They can be moved by a method in which they are moved in different directions, namely, one is moved in the Y direction and the other in the −Y direction (phase-shifting method). When the phase-shifting method is adopted, the deflection reducing lens 14C is required to have a structure for inverting an image as in a case of dealing with light. As is understood from FIG. 1, when the in-phase method is adopted and the substrate stage 12 and the mask stage 17 are moved in the same direction, the center of gravity of the entire system is largely moved, and hence, the system can be unstabilized during the operation. However, when the phase-shifting method is adopted, this can be avoided and the system is stabilized during the operation.

Furthermore, synchronization in the movement between the substrate stage 12 and the mask stage 17 depends upon design magnification of the circuit pattern 16a formed on the mask 16. Specifically, when the design magnification of the circuit pattern 16a is, for example, four-fold, the mask stage 17 is moved at a speed four times as high as that of the substrate stage 12 both in the in-phase method and the phase-shifting method.

In this embodiment, since the pitch P is smaller than the maximum width W, a double exposure portion 22a that is doubly exposed can be formed in side parts of each partial exposure area 22. A portion of the partial exposure area 22 excluding the double exposure portion 22a is herein designated as a non-double exposure portion 22b for convenience. At this point, a difference between the maximum width W and the pitch P is 10 μm or less, and hence, the double exposure portion 22a has a width of 10 μm or less.

Figure 3:
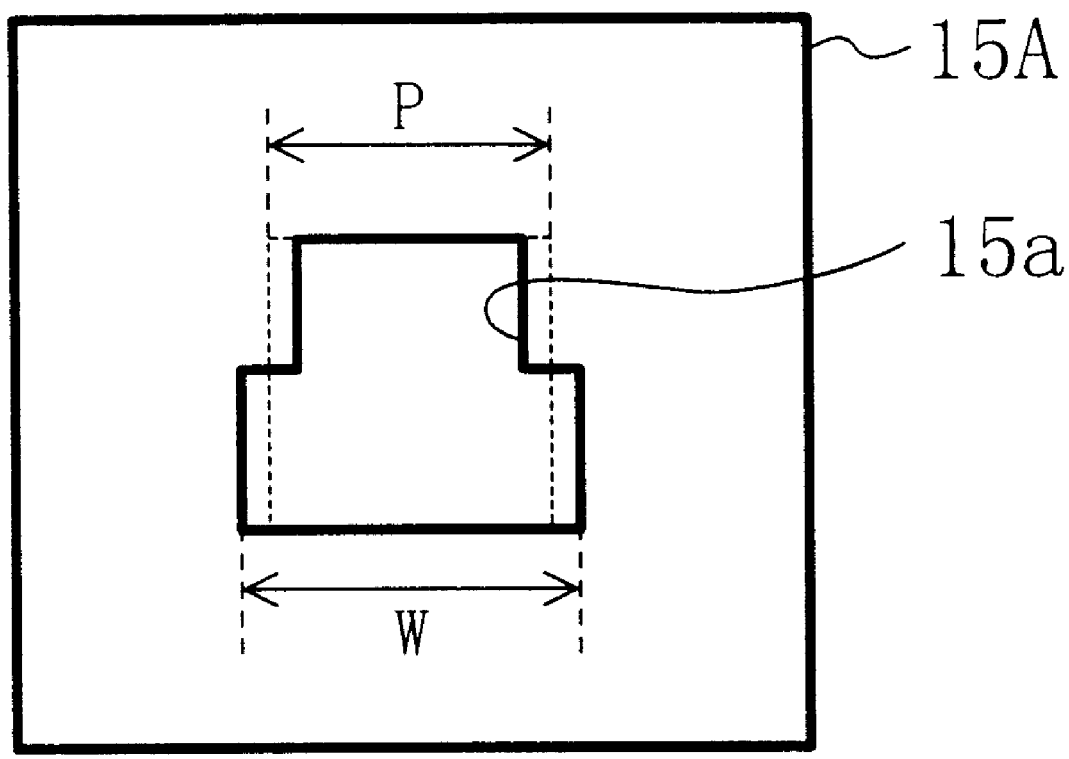
FIG. 3 is a plan view of a shaping aperture of the charged particle lithography system of Embodiment 1.

As another characteristic of this embodiment, an exposure dose in the double exposure portion 22a and an exposure dose in the non-double exposure portion 22b are equal to each other in the partial exposure area 22, namely, a total dose in the entire circuit pattern 16a is uniform. For this purpose, a shaping aperture 15A having an aperture pattern 15a as is shown in FIG. 3 is used. The aperture pattern has an area of approximately 1 mm² and includes side areas with a width of P/2±d on both sides, and a half of each side area is masked so as to attain an aperture ratio of substantially 50%.

Figure 4A:
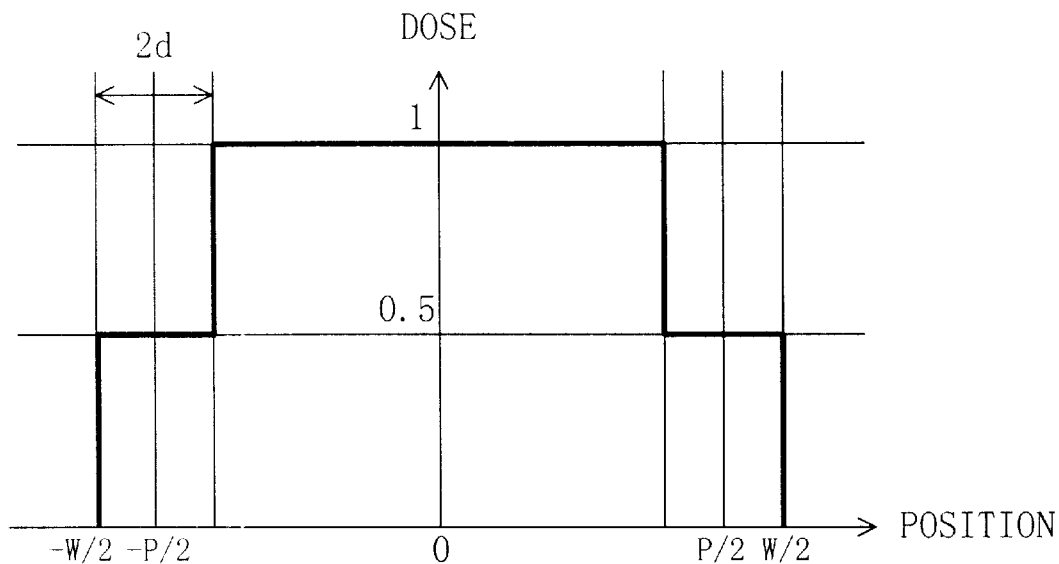
FIG. 4(a) is a graph for showing dose distribution obtained by an electron beam having passed through the shaping aperture of the charged particle lithography system of Embodiment 1.
Figure 4B:
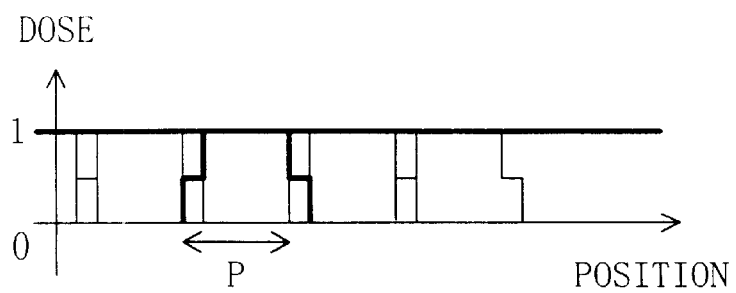
FIG. 4(b) is a graph for showing dose distribution obtained by overlapping electron beams having passed through the shaping aperture of the charged particle lithography system of Embodiment 1.

FIG. 4(a) shows distribution in the X direction of a total dose obtained when the electron beam having passed through the shaping aperture 15A of FIG. 3 transmits the circuit pattern 16a. As is shown in FIG. 4(a), a dose in areas where X=−P/2±d and X=P/2±d corresponding to the double exposure portions 22a shown in FIG. 2 is a half of a dose in an area corresponding to the non-double exposure portion 22b of FIG. 2. Also, FIG. 4(b) shows dose distribution obtained when the dose distribution of FIG. 4(a) is shifted in the X direction by the pitch P. As is shown in FIG. 4(b), a total dose corresponding to a height obtained as a sum of the dose distribution is a predetermined dose, that is, 1, when partial transfer for doubly exposing the partial exposure areas 22 of FIG. 2 is conducted. Also, the distribution in the X direction of the total dose is symmetrical about the Y axis.

Now, exposure by using the shaping aperture 15A of FIG. 3 will be examined. In the exposure with the mask 16 and the semiconductor substrate 11 repeatedly moved by a distance corresponding to the pitch P, when the movement corresponding to the pitch P always accords with a predetermined value, the double exposure portions 22a where the dose is halved can completely overlap each other. Therefore, the entire circuit pattern 16a can be exposed to attain the predetermined dose.

Figure 5A:
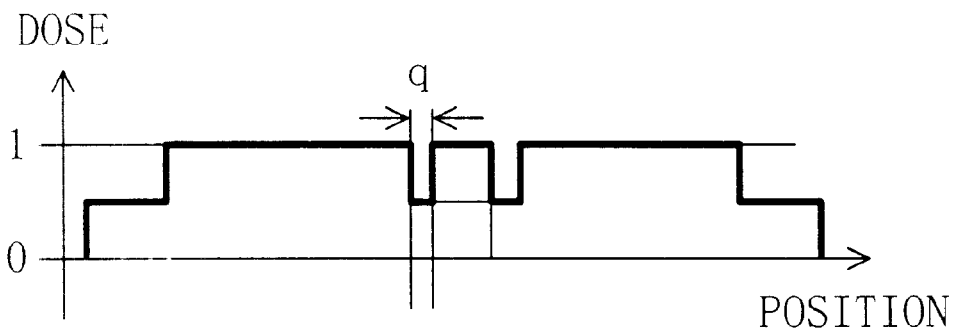
FIG. 5(a) is a graph for showing dose distribution obtained when there arises a connection error in exposure conducted by overlapping electron beams having passed through the shaping aperture of the charged particle lithography system of Embodiment 1.
Figure 5B:
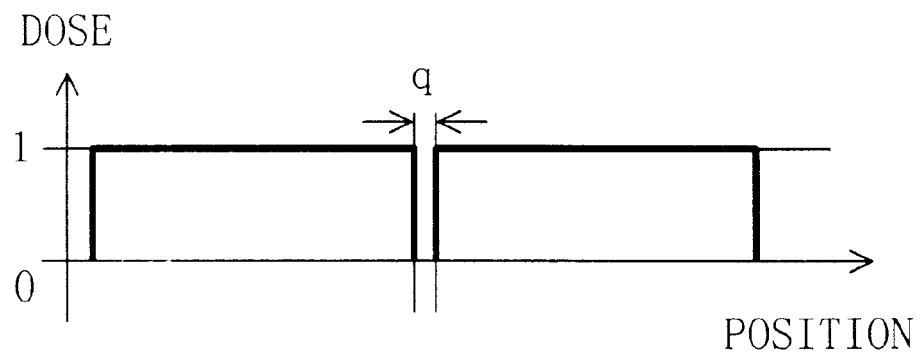
FIG. 5(b) is a graph for showing dose distribution obtained when there arises a connection error in using an electron beam having passed through a conventional shaping aperture.

It is herein assumed that the pitch P is slightly varied to P+q including a pitch error q (wherein q is positive). A factor to vary the pitch P is derived from, for example, an error in detecting the position of the substrate stage 12 or the like. When the shaping aperture 15A of this embodiment is used, there arises an area where the total dose is varied as is shown in FIG. 5(a), but as far as q<(W−P)/2, the reduced dose is ½ at most. In the area where the dose is ½, although a line width is reduced, the reduced line width does not lead to disconnection. When the shaping aperture has a square aperture pattern as in the conventional technique, there arises an area where the total dose is 0 as is shown in FIG. 5(b). Therefore, in using a negative resist, when a circuit pattern is present in the area where the total dose is 0, disconnection occurs.

Furthermore, in this embodiment, when the pitch error q is sufficiently small, line width variation is hardly caused. Also in the case where the pitch error q is negative, when the shaping aperture 15A is used, a dose in the areas where X=−P/2±d and X=P/2±d in the partial exposure area 22 is a half of that in the area corresponding to the non-double exposure portion 22b, and hence, line width variation and pattern deformation can be scarcely caused. Needless to say, each of side areas with a width 2d corresponding to the side areas of the shaping aperture 15A where the exposure dose is halved is set to be larger than a presumed pitch error q (connection error).

Figure 6:
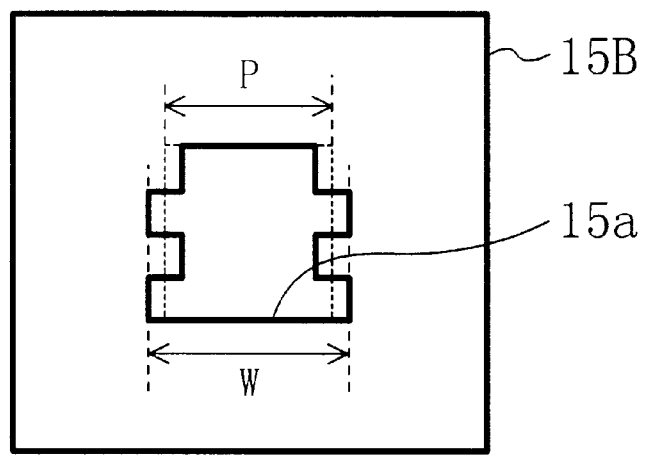
FIG. 6 is a plan view of another shaping aperture of the charged particle lithography system of Embodiment 1.

Moreover, it is possible to use a shaping aperture 15B shown in FIG. 6 having an aperture pattern 15a including side areas with a width of P/2±d having an aperture ratio of substantially 50%.

First Modification of Embodiment 1

A first modification of Embodiment 1 will now be described with reference to the accompanying drawings.

Figure 7:
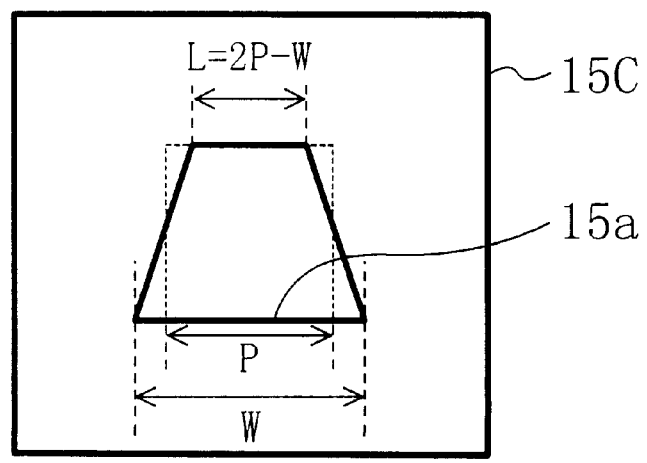
FIG. 7 is a plan view of a shaping aperture of a charged particle lithography system according to a first modification of Embodiment 1.

FIG. 7 is a plan view of a shaping aperture used in a charged particle lithography system of this modification. As is shown in FIG. 7, the shaping aperture 15C has a trapezoidal aperture pattern 15a. When the maximum width of the aperture pattern 15a is indicated by W and a pitch corresponding to the movement for repeated exposure is indicated by P, the lower side of the trapezoid is indicated by W and the upper side thereof L is indicated by 2P−W.

Figure 8A:
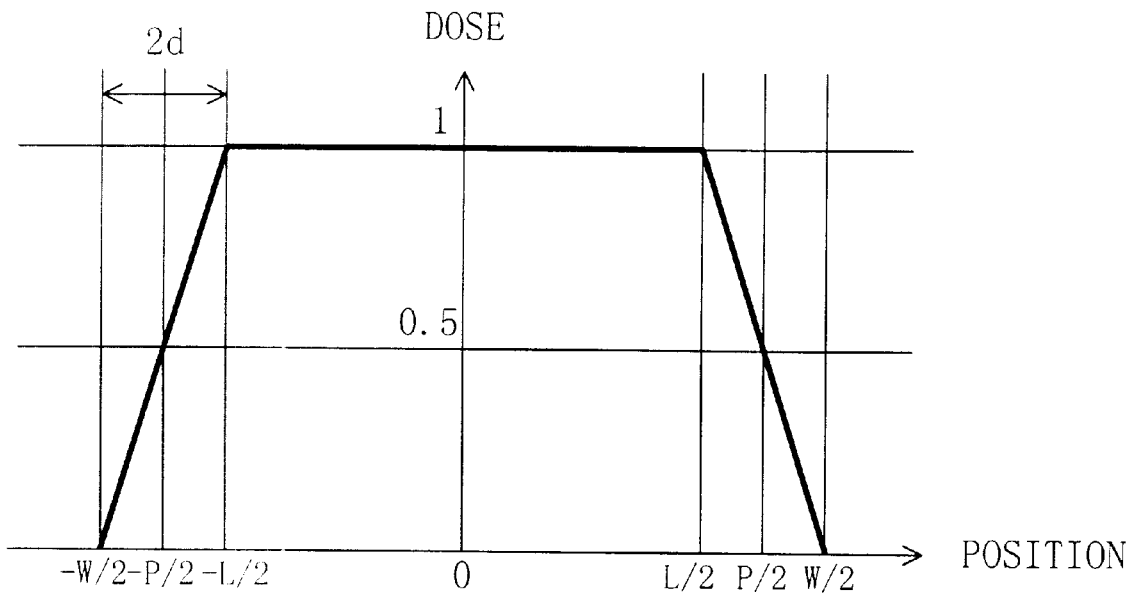
FIG. 8(a) is a graph for showing dose distribution obtained by an electron beam having passed through the shaping aperture of the charged particle lithography system of the first modification of Embodiment 1.

FIG. 8(a) shows the distribution in the X direction of a total dose obtained when an electron beam having passed through the shaping aperture 15C of FIG. 7 transmits the circuit pattern 16a. As is shown in FIG. 8(a), the dose is linearly continuously changed so as to be 1, that is, the predetermined dose, in an area where −L/2≦X≦L/2, to be 0.5 in an area where X=±P/2 and to be 0 in an area where X=±W/2.

Figure 8B:
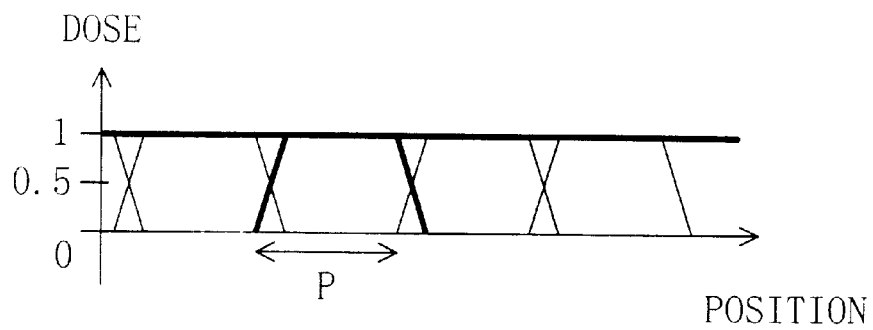
FIG. 8(b) is a graph for showing dose distribution obtained by overlapping electron beams having passed through the shaping aperture of the charged particle lithography system of the first modification of Embodiment 1.

Now, the exposure by using the shaping aperture 15C of FIG. 7 will be examined. In the exposure with the mask 16 and the semiconductor substrate 11 repeatedly moved by a distance corresponding to the pitch P, when the movement corresponding to the pitch P always accords with a predetermined value, the entire circuit pattern 16a can be exposed to attain a uniform dose as is shown in FIG. 8(b). Accordingly, when a shaping aperture having a lower side W larger than an upper side L, such as the shaping aperture 15C, is used, part of the circuit pattern 16a can be doubly exposed. Herein, in the shaping aperture 15C of FIG. 7, a difference between the lower side W and the upper side L is 10 μm or less. In other words, an area in the shaping aperture 15C corresponding to the double exposure portion 22a of FIG. 2 has a width of 10 μm or less.

As is obvious from FIG. 8(b), when the movement corresponding to the pitch P always accords with the predetermined value, the sum of the doses in the double exposure portion 22a of FIG. 2 is always 1, and hence, the entire circuit pattern 16a is exposed to attain the uniform dose.

Figure 9A:
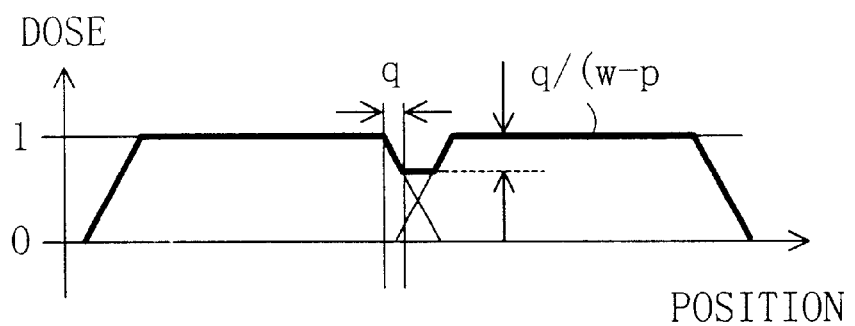
FIG. 9(a) is a graph for showing dose distribution obtained when there arises a connection error in exposure conducted by overlapping electron beams having passed through the shaping aperture of the charged particle lithography system of the first modification of Embodiment 1.
Figure 9B:
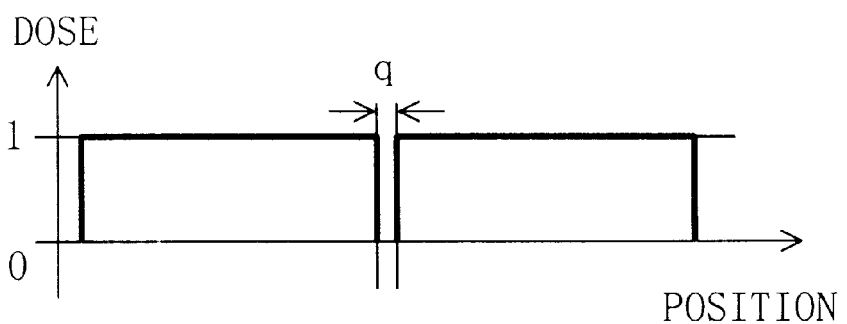
FIG. 9(b) is a graph for showing dose distribution obtained when there arises a connection error in using an electron beam having passed through a conventional shaping aperture.

At this point, it is assumed that the pitch P is slightly varied to P+q including a pitch error q (>0). When the shaping aperture 15C of this modification is used, there arises an area where the total dose is varied as is shown in FIG. 5(a), but the reduced dose is q/(W−P). This means that when q=(W−P)/2, the dose is halved. When q<(W−P)/2, the reduced dose is smaller than ½, which scarcely causes pattern deformation of the circuit pattern 16a. When the shaping aperture has a square aperture pattern as in the conventional technique, there arises an area where the total dose is 0 as is shown in FIG. 9(b). Therefore, in using a negative resist, when a circuit pattern is present in the area where the total dose is 0, disconnection occurs.

Also when the pitch error q is negative, line width variation and pattern deformation can be prevented by using the shaping aperture 15C because the dose in the area where X=±P/2 in the partial exposure area 22 is 0.5. Needless to say, each of side areas with a width 2d corresponding to the side areas of the shaping aperture 15C is set to be larger than a presumed pitch error (connection error) q.

Figure 10A:
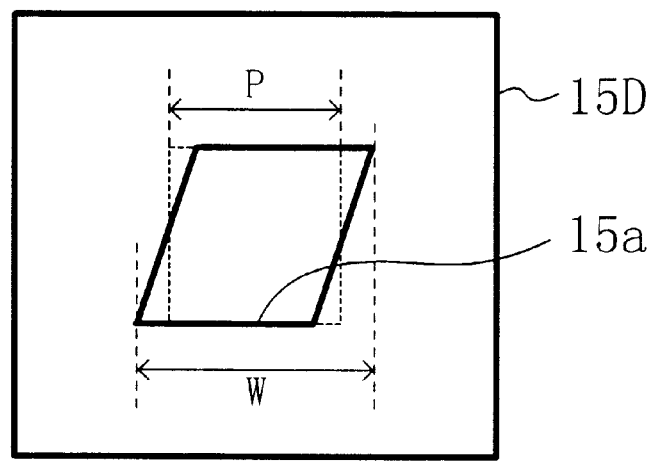
FIGS. 10(a) and 10(b) are plan views of other shaping apertures of the charged particle lithography system of the first modification of Embodiment 1.
Figure 10B:
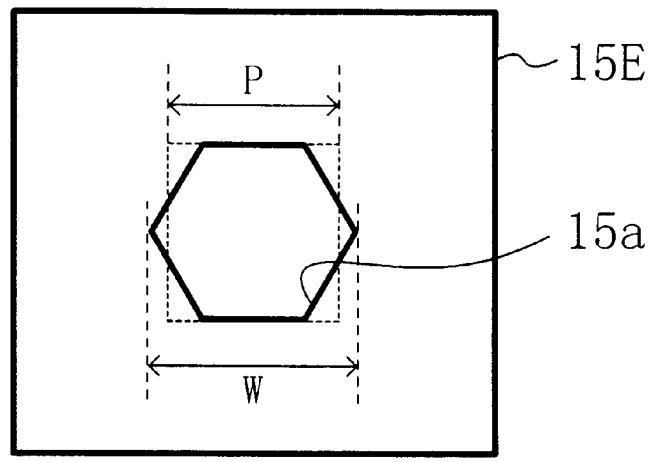

Also, it is possible to use a shaping aperture 15D having a parallelogrammatic aperture pattern 15a as is shown in FIG. 10(a) or a shaping aperture 15E having a hexagonal aperture pattern 15a as is shown in FIG. 10(b).

Second Modification of Embodiment 1

A second modification of Embodiment 1 will now be described with reference to the accompanying drawings.

Figure 11A:
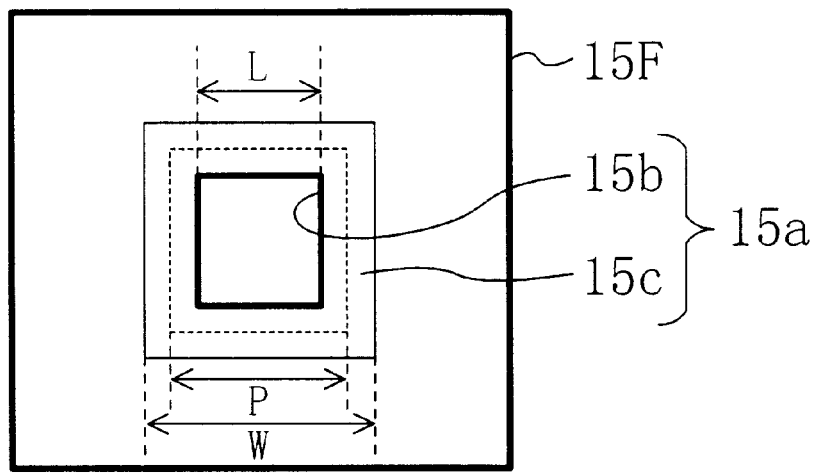
FIG. 11(a) is a plan view of a shaping aperture of a charged particle lithography system according to a second modification of Embodiment 1.

FIG. 11(a) is a plan view of a shaping aperture used in a charged particle lithography system according to this modification. As is shown in FIG. 11(a), the shaping aperture 15F having a rectangular aperture pattern 15a includes an aperture portion 15b with a width L having electron beam transmittance of 100% and an aperture peripheral portion 15c corresponding to an area sandwiched between the maximum width W of the aperture pattern 15a and the aperture width L and having electron beam transmittance of substantially 50%. In this case, it goes without saying that an area disposed outside of the aperture peripheral portion 15c in the shaping aperture 15F has electron beam transmittance of substantially 0%. Furthermore, there is a relationship of P=(L+W)/2 between the pitch P corresponding to movement in repeated exposure, the maximum width W and the aperture width L. Also, a difference between the maximum width W and the pitch P is 10 μm or less, and hence, the double exposure portion 22a of FIG. 2 has a width of 10 μm or less.

Figure 12A:
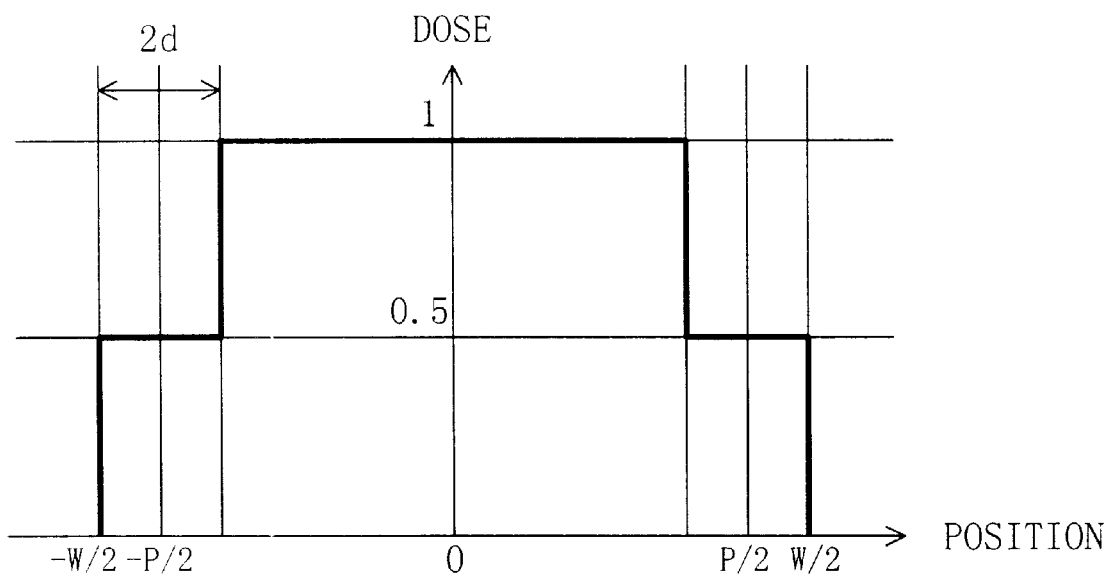
FIG. 12(a) is a graph for showing dose distribution obtained by an electron beam having passed through the shaping aperture of the charged particle lithography system of the second modification of Embodiment 1.

FIG. 12(a) shows distribution in the X direction of a total dose obtained when an electron beam having passed through the shaping aperture 15F of FIG. 11(a) transmits the circuit pattern 16a. As is shown in FIG. 12(a), in assuming that a dose in an area corresponding to the aperture portion 15b is 1, a does in an area where X=±P/2 is obviously ½. The width of the area where the does is not 1 is indicated by 2d (=(W−L)/2). In this case, in each of areas where −W/2<X<−L/2 and L/2<X<W/2, the dose is a half of that in the area corresponding to the aperture portion 15b.

Figure 12B:
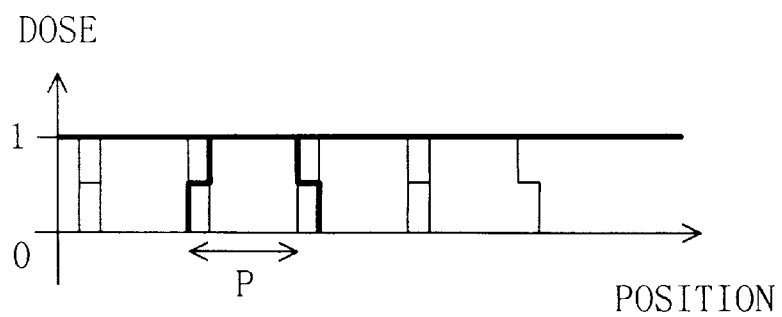
FIG. 12(b) is a graph for showing dose distribution obtained by overlapping electron beams having passed through the shaping aperture of the charged particle lithography system of the second modification of Embodiment 1.

Furthermore, FIG. 12(b) shows dose distribution obtained by shifting the dose distribution of FIG. 12(b) in the X direction by a distance corresponding to the pitch P. As is shown in FIG. 12(b), a height obtained as a sum of the dose distribution, namely, the total dose, is 1, that is, the predetermined dose. Also, the distribution of the total dose in the X direction is symmetrical about the Y-axis.

Now, exposure by using the shaping aperture 15F of FIG. 11 will be examined. In the exposure with the mask 16 and the semiconductor substrate 11 repeatedly moved by a distance corresponding to the pitch P, when the movement corresponding to the pitch P always accords with a predetermined value, areas each corresponding to the aperture peripheral portion 15c where the dose is ½, namely, the double exposure portions 22a of FIG. 2, can completely overlap each other, so that the sum of the doses in the double exposure portion 22a is always 1. Accordingly, the entire circuit pattern 16a can be exposed to attain the predetermined dose.

Figure 13A:
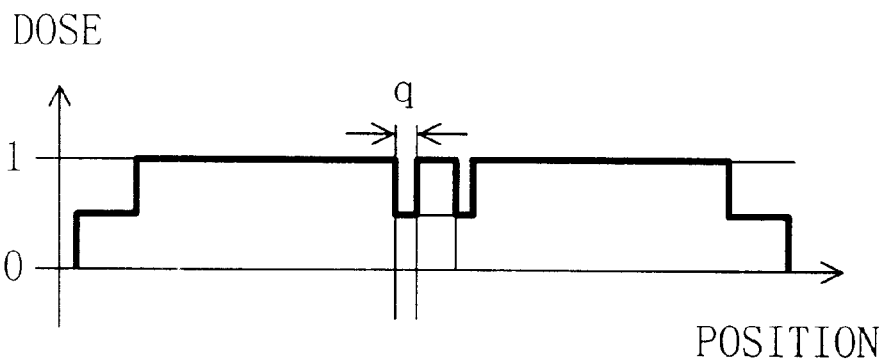
FIG. 13(a) is a graph for showing dose distribution obtained when there arises a connection error in exposure conducted by overlapping electron beams having passed through the shaping aperture of the charged particle lithography system of the second modification of Embodiment 1.
Figure 13B:
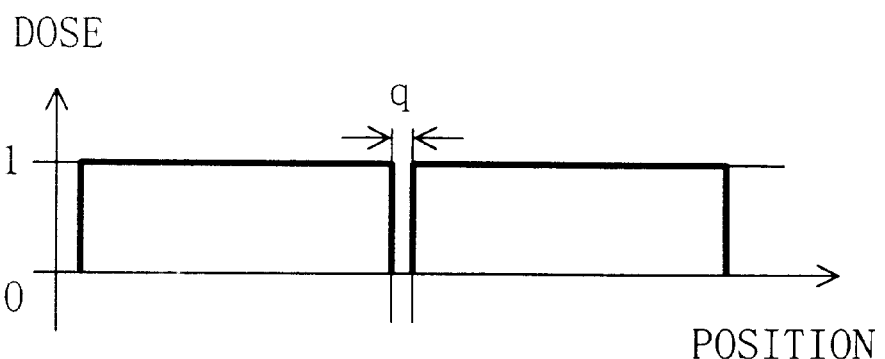
FIG. 13(b) is a graph for showing dose distribution obtained when there arises a connection error in using an electron beam having passed through a conventional shaping aperture.

It is herein assumed that the pitch P is slightly varied to P+q including a pitch error q (>0). When the shaping aperture 15F of this modification is used, there arises an area where the total dose is varied as is shown in FIG. 13(a), but the reduced dose is ½ at most. Although a line width is reduced in the area where the dose is ½, this does not lead to disconnection. When the shaping aperture has a square aperture pattern as in the conventional technique, there arises an area where the total dose is 0 as is shown in FIG. 13(b). Therefore, in using a negative resist, when a circuit pattern is present in the area where the total dose is 0, disconnection occurs.

In this modification, when the pitch error q is sufficiently small, line width variation is hardly caused. Also when the pitch error q is negative, line width variation and pattern deformation can be prevented by using the shaping aperture 15F because the dose in the areas where X=−P/2±d and X=P/2±d in the partial exposure area 22 is ½ of that in the area corresponding to the non-double exposure portion 22b of FIG. 2. Needless to say, each of side areas with a width 2d on both sides of the shaping aperture 15F where the exposure dose is halved is set to be larger than a presumed pitch error (connection error) q.

Since the shaping aperture 15F of this modification includes the aperture peripheral portion 15c having electron beam transmittance of 50% in the periphery of the aperture pattern 15a, it is not only applicable to the beam scanning method but also applicable to a step-and-repeat exposure method in which the mask 16 and the semiconductor substrate 11 are stopped for a predetermined time duration for exposure. In this case, it is necessary to move the mask 16 and the semiconductor substrate 11 so that an area corresponding to an upper end portion or a lower end portion of the aperture peripheral portion 15c can be a double exposure portion to be doubly exposed.

Third Modification of Embodiment 1

A third modification of Embodiment 1 will now be described with reference to the accompanying drawing.

Figure 11B:
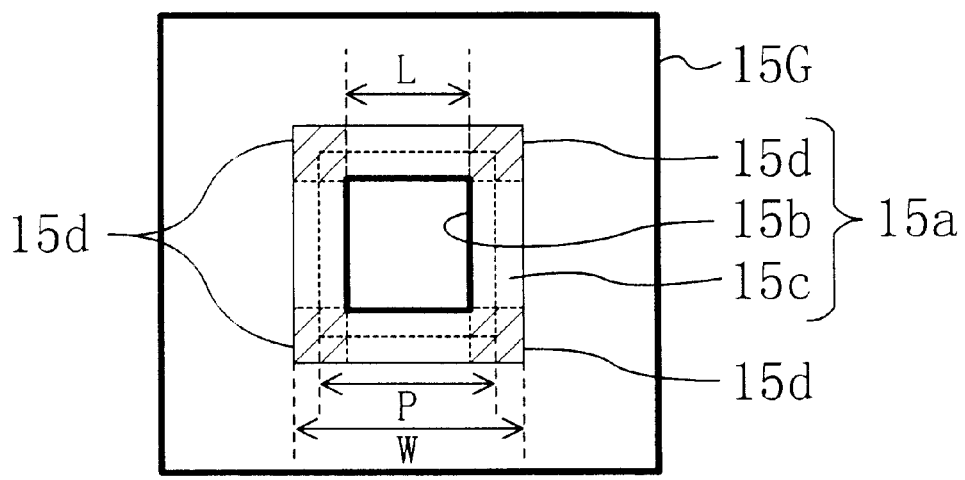
FIG. 11(b) is a plan view of a shaping aperture of a charged particle lithography system according to a third modification of Embodiment 1.

FIG. 11(b) is a plan view of a shaping aperture used in a charged particle lithography system according to this modification. As is shown in FIG. 11(b), the shaping aperture 15G having a rectangular aperture pattern 15a includes an aperture portion 15b with a width L having electron beam transmittance of 100%, an aperture peripheral portion 15c corresponding to an area sandwiched between the maximum width W and the aperture width L and having electron beam transmittance of substantially 50%, and an aperture corner portion 15d corresponding to each corner of the aperture peripheral portion 15c and having electron beam transmittance of approximately 25%. It goes without saying that an area disposed outside of the aperture peripheral portion 15c and the aperture corner portions 15d in the shaping aperture 15G has electron beam transmittance of substantially 0%. By adopting this structure, the total dose can be definitely made to be 1 when the step-and-repeat exposure method is used.

Furthermore, in each of the second and third modifications, the aperture peripheral portion 15c and the aperture corner portions 15d respectively having electron beam transmittance of 50% and 25% are made from a thin film of silicon nitride (SIN), and the aperture base having electron beam transmittance of substantially 0% is made from sufficiently thick silicon (Si).

Moreover, when the shaping aperture 15F of the second modification is used in the scanning method alone, an area having a width of 2*d* and electron beam transmittance of 50% can be formed on both sides alone of the aperture portion 15*a*.

Embodiment 2

Embodiment 2 of the invention will now be described with reference to the accompanying drawings.

Figure 14:
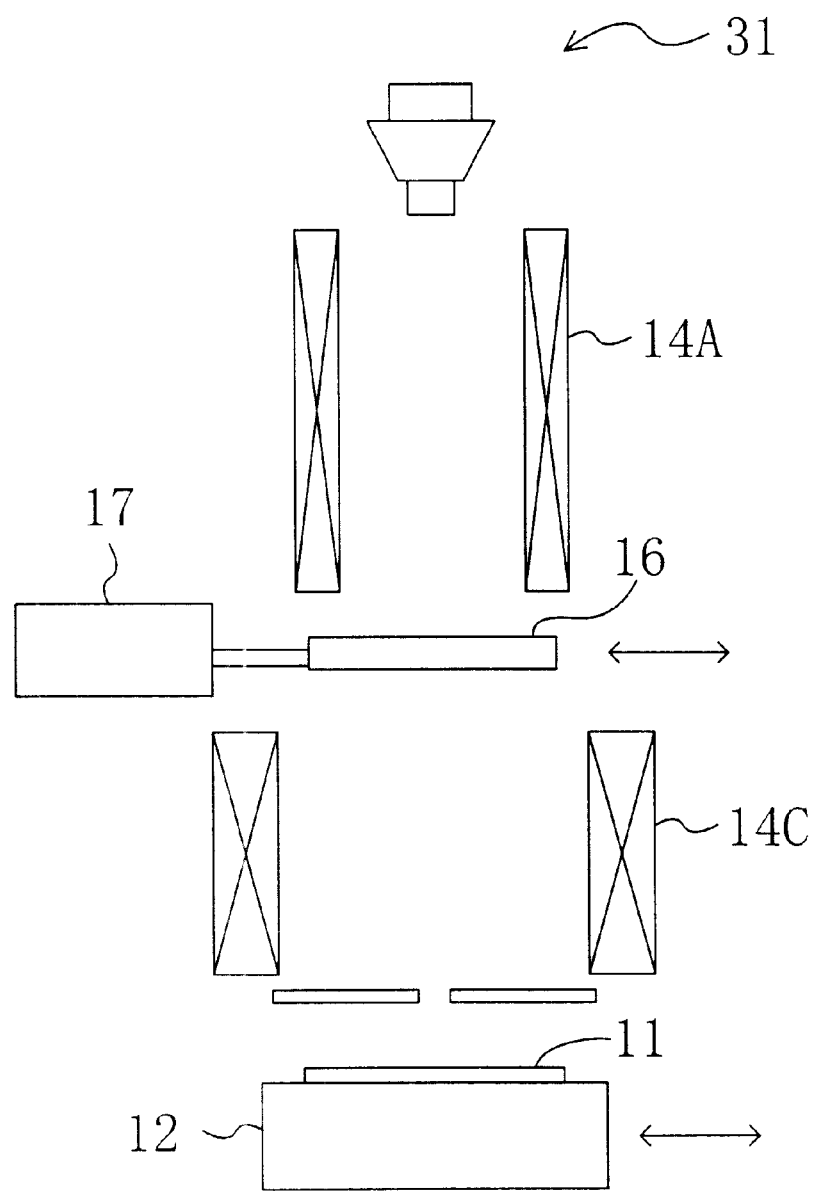
FIG. 14 is a schematic front view of a charged particle lithography system according to Embodiment 2 of the invention.

FIG. 14 is a schematic front view of a charged particle lithography system according to Embodiment 2. In FIG. 14, like reference numerals are used to like elements shown in FIG. 1 and the description is omitted. In Embodiment 1, the shape of the peripheral portion of the aperture pattern of the shaping aperture is characterized in order to reduce the exposure dose of the electron beam in the double exposure portion to a half of that in the non-double exposure portion. In this embodiment, the electron gun corresponding to the charged particle producing means is characterized. Accordingly, as is shown in FIG. 14, no shaping aperture is provided between an electron gun 31 and the mask 16 in this embodiment.

Figure 15A:
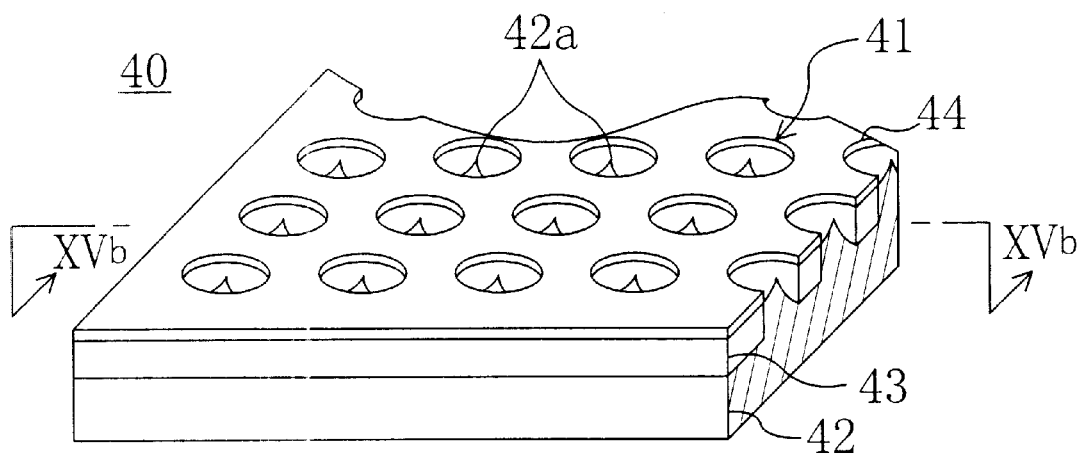
FIG. 15(a) is a partial perspective view of a charged particle producing source in the charged particle lithography system of Embodiment 2 and FIG. 15(b) is a sectional view thereof taken on line XVb—XVb of FIG. 15(a)
Figure 15B:
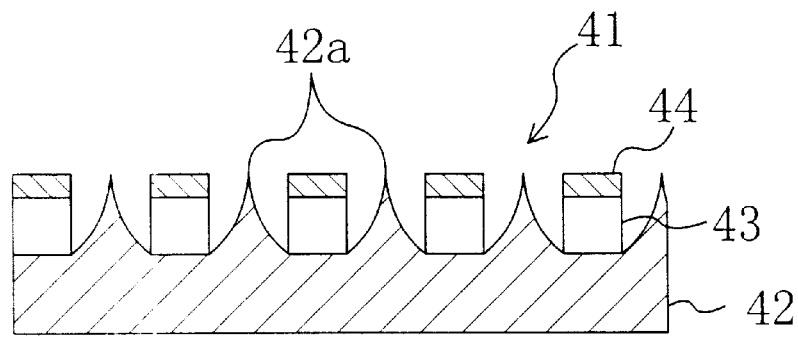

FIG. 15(*a*) shows the partial structure of a charged particle producing source 40 of the electron gun 31 of this embodiment in which plural field emission type electron sources are arranged in the shape of an array, and FIG. 15(*b*) shows a sectional structure thereof taken on line XVb—XVb of FIG. 15(*a*). In the charged particle producing source 40 of FIGS. 15(*a*) and 15(*b*), plural field emission type electron sources 41, such as one disclosed in Japanese Laid-Open Patent Publication No. 9-27266, are arranged on a substrate. Each field emission type electron source 41 includes a negative electrode 42*a* in the shape of a corn formed on a substrate 42 of conductive silicon, and an extraction electrode 44 of a metallic film formed on the substrate 42 with an insulating film 43 sandwiched therebetween and having an opening around the tip of each negative electrode 42*a*. A negative voltage is applied to the negative electrodes 42*a* and a positive voltage is applied to the extraction electrode 44, so as to extract electrons from the negative electrodes 42*a*. The amount of the electrons to be extracted can be controlled by the voltage applied to the extraction electrode 44. Although not shown in the drawings, a positive electrode for accelerating the extracted electrons is disposed so as to oppose the negative electrodes 42*a*.

Figure 16A:
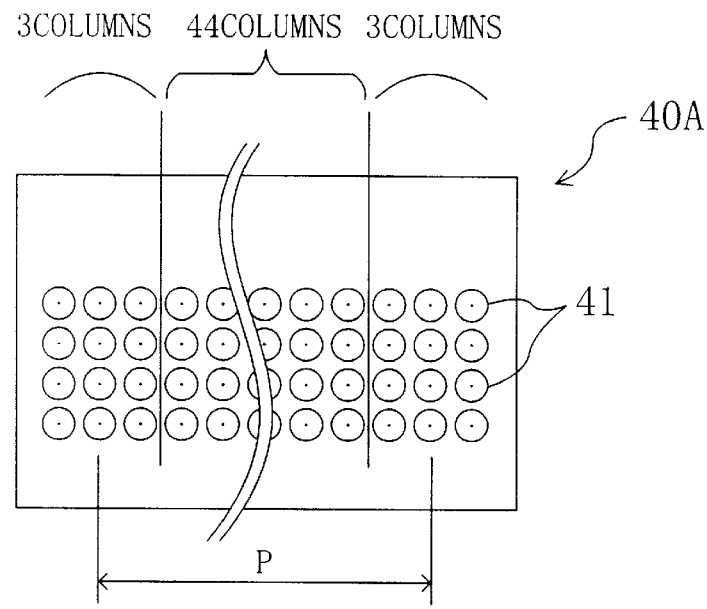
FIG. 16(a) is a simplified plan view of the charged particle producing source of the charged particle lithography system of Embodiment 2.
Figure 16B:
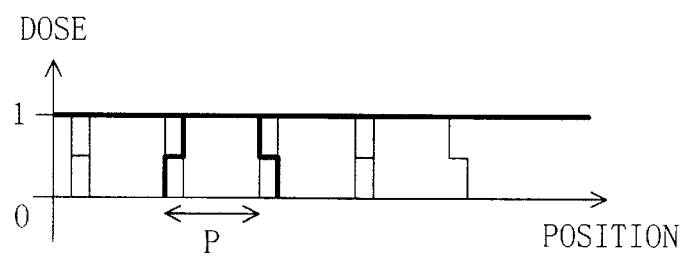
FIG. 16(b) is a graph for showing dose distribution obtained by overlapping electron beams emitted from the charged particle producing source of the charged particle lithography system of Embodiment 2.
Figure 16C:
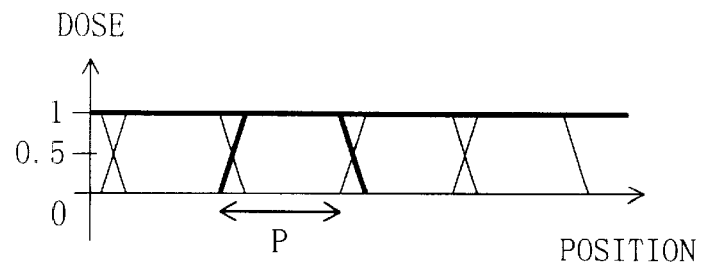
FIG. 16(c) is a graph for showing dose distribution obtained by overlapping electron beams emitted from a charged particle producing source of a charged particle lithography system according to a first modification of Embodiment 2.

FIG. 16(*a*) shows the simplified front structure of the charged particle producing source of this embodiment. As is shown in FIG. 16(*a*), the charged particle producing source 40A includes 200 field emission type electron sources 41 arranged in an array of 4 rows by 50 columns. As a characteristic of this embodiment, among the field emission type electron sources 41 arranged in the 50 columns, those disposed in 3 columns at each side end have an output power of approximately 50% of that of the other field emission type electron sources 41 disposed in the central 44 columns.

Accordingly, when the electron beam is scanned so that the electron sources in the 3 columns at each side end can correspond to each of the double exposure portions 22*a* in the partial exposure area 22 of FIG. 2 and the electron sources in the central 44 columns can correspond to the non-double exposure portion 22*b* of FIG. 2, the doses in the double exposure portions 22*a* and the non-double exposure portion 22*b*, namely, the total dose, can be substantially uniform as is shown in FIG. 16(*b*).

First Modification of Embodiment 2

In the charged particle producing source 40A of FIG. 16(*a*), among the field emission type electron sources 41 arranged in the 50 columns, the output powers of the electron sources of three groups each aligned in 3 columns from each side end are increased in a stepwise manner in the inward direction, so that the output power of those belonging to the group of the outermost 3 columns can be approximately 25%, the output power of those belonging to the group of the subsequent inner 3 columns can be approximately 50%, and the output power of those belonging to the group of the further subsequent inner 3 columns can be approximately 75%. The output power of the electron sources in the central 44 columns is 100%. In this manner, the total dose in the double exposure portions 22*a* and the non-double exposure portion 22*b* can be substantially uniform as is shown in FIG. 16(*c*).

Second Modification of Embodiment 2

Figure 17A:
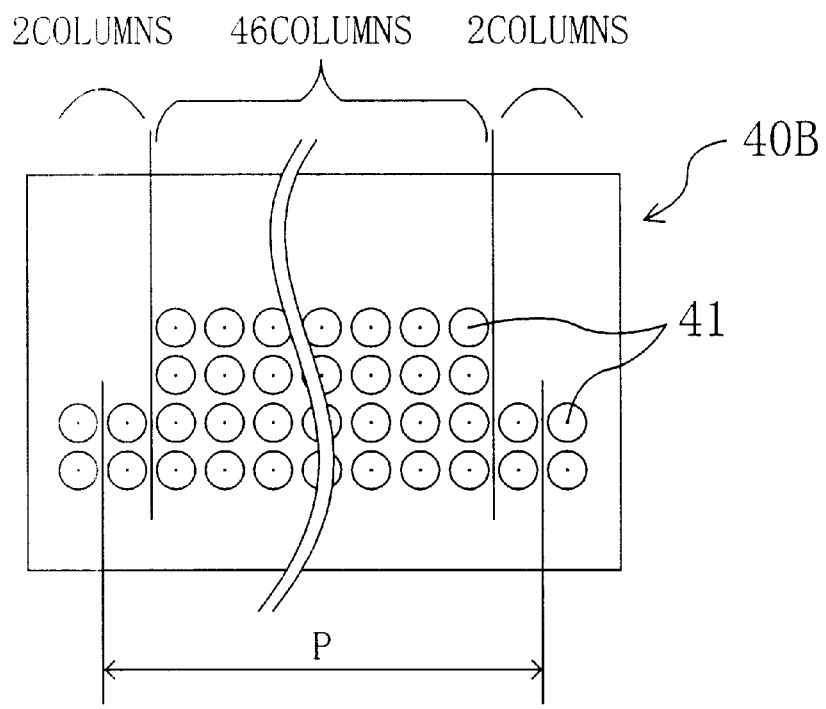
FIG. 17(a) is a simplified plan view of a charged particle producing source of a charged particle lithography system according to a second modification of Embodiment 2.
Figure 17B:
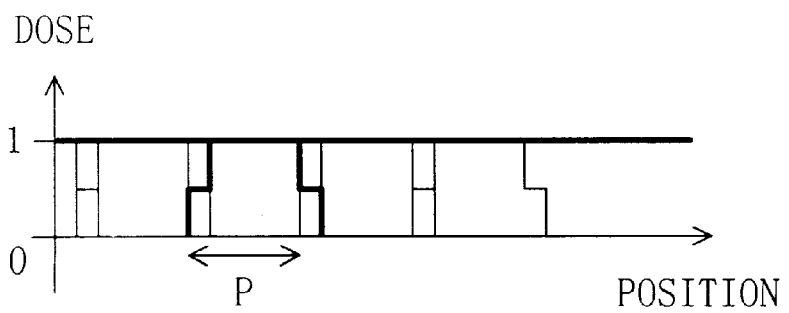
FIG. 17(b) is a graph for showing dose distribution obtained by overlapping electron beams emitted from the charged particle producing source of the charged particle lithography system of the second modification of Embodiment 2.

FIG. 17(*a*) shows the simplified front structure of a charged particle producing source of this modification. As is shown in FIG. 17(*a*), the charged particle producing source 40B includes 184 field emission type electron sources 41 arranged in an array of 4 rows by 46 columns disposed at the center, and 8 field emission type electron sources 41 disposed on both sides of the center array and arranged in an array of 2 rows by 2 columns along each side of the center array. In this manner, the number of field emission electron sources 41 is halved in 2 columns at both side ends as compared with that in the center array. Therefore, the output power of the side array is substantially halved as compared with that in the center array. Accordingly, when the electron beam is scanned so that the electron sources in the 2 columns at each side end can correspond to the double exposure portion 22*a* of the partial exposure area 22 of FIG. 2 and the electron sources in the cental 46 columns can correspond to the non-double exposure portion 22*b* of FIG. 2, the dose in the double exposure portion 22*a* and the non-double exposure portion 22*b*, namely, the total dose, can be substantially uniform as is shown in FIG. 17(*b*).

Third Modification of Embodiment 2

Figure 18A:
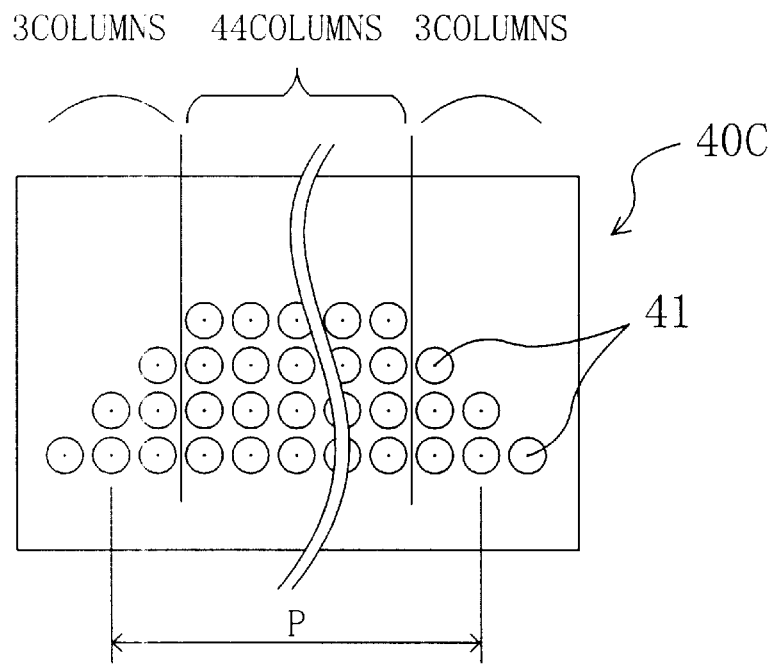
FIG. 18(a) is a simplified plan view of a charged particle producing source of a charged particle lithography system according to a third modification of Embodiment 2.
Figure 18B:
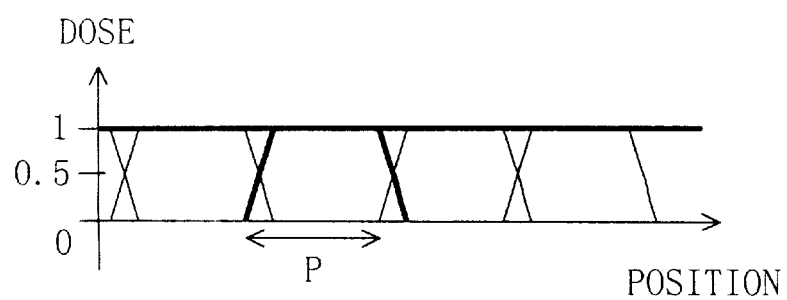
FIG. 18(b) is a graph for showing dose distribution obtained by overlapping electron beams emitted from the charged particle producing source of the charged particle lithography system of the third modification of Embodiment 2.
Figure 19:
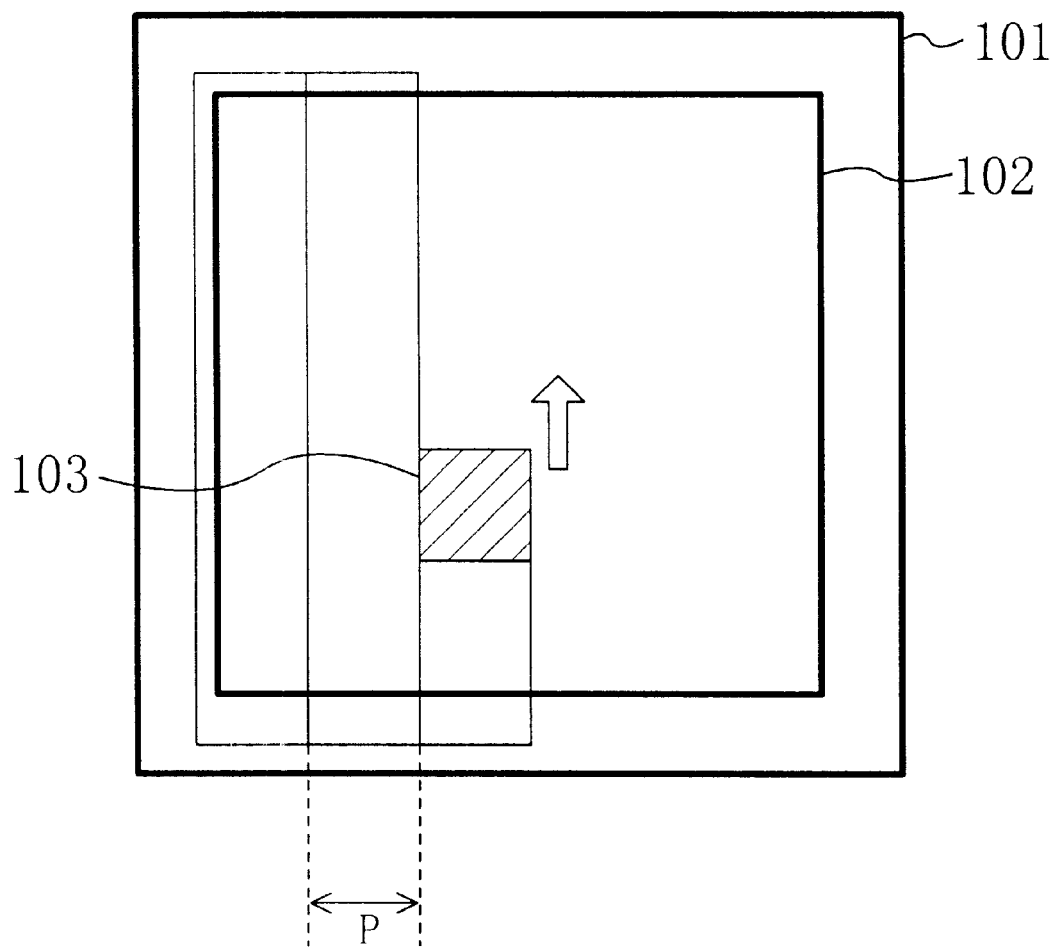
FIG. 19 is a plan view of a mask for illustrating lithography using the mask conducted by a conventional electron beam lithography system.
Figure 20:
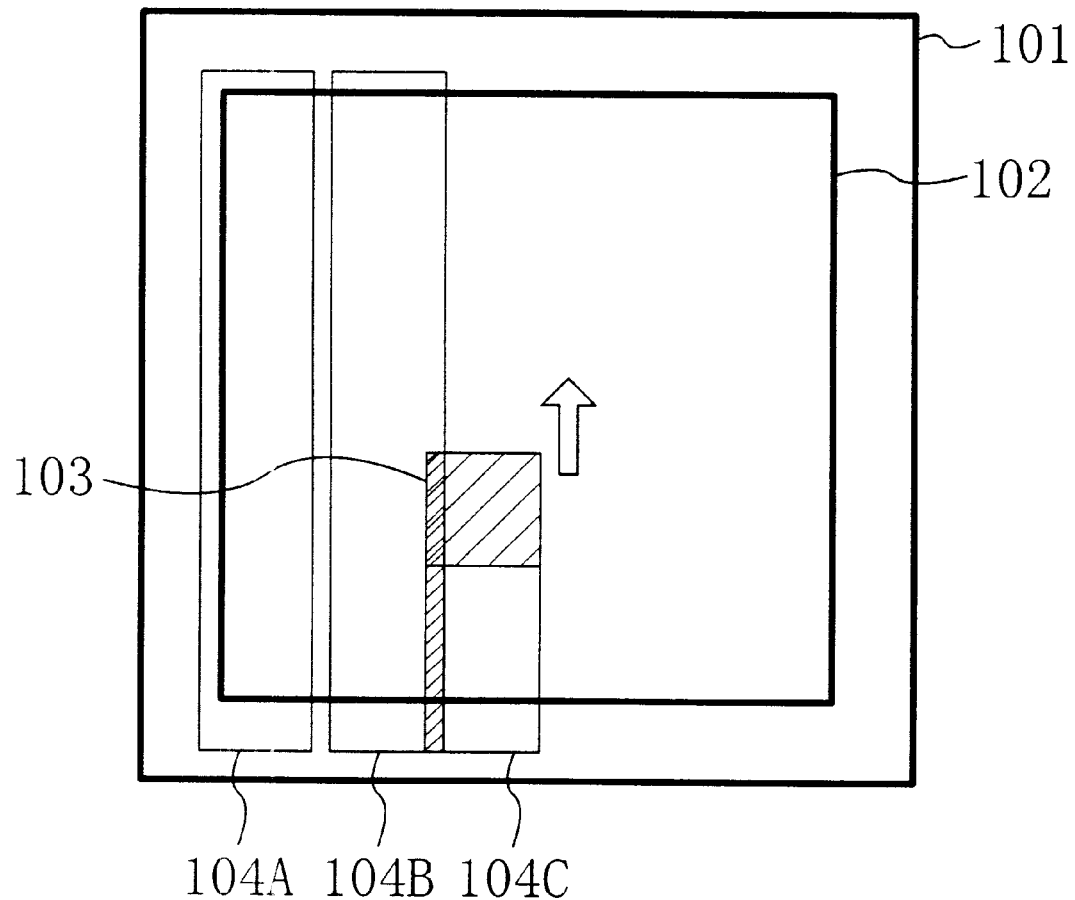
FIG. 20 is a plan view of a mask for illustrating connection errors occurring during the lithography using the mask conducted by the conventional electron beam lithography system.
Figure 21:
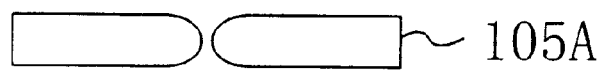
FIGS. 21(a) through 21(c) are plan views of resist patterns formed when the connection errors occur during the lithography using the mask conducted by the conventional electron beam lithography system.
Figure 21:
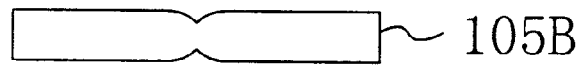
Figure 21:
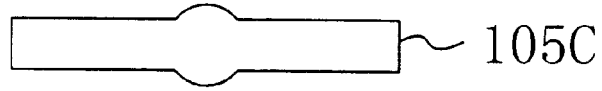

FIG. 18(*a*) shows the simplified front structure of a charged particle producing source of this modification. As is shown in FIG. 18(*a*), the charged particle producing source 40C includes 156 field emission type electron sources 41 arranged in an array of 4 rows by 4 columns and disposed at the center, and 12 field emission type electron sources 41 disposed in 3 columns on each side of the center array with the numbers of electron sources aligned in the respective columns reduced to 3, 2 and 1 in the outward direction. In this manner, as compared with that in the center array, the number of the field emission electron sources 41 is gradually reduced in the 3 columns at both side ends. Accordingly, when the electron beam is scanned so that the electron sources in the 3 columns at each side end can correspond to the double exposure portion 22*a* of the partial exposure area 22 of FIG. 2 and the electron sources in the central 44 columns can correspond to the non-double exposure portion 22*b* of FIG. 2, the dose in the double exposure portion 22*a* and the non-double exposure portion 22*b*, namely, the total dose, can be substantially uniform as is shown in FIG. 18(*b*).

Although an electron beam is used as the charged particles in each of Embodiments 1 and 2, the same effects can be attained by using an ion beam instead.

What is claimed is:

1. A charged particle lithography method comprising:
    a beam shaping step of shaping an output beam emitted from a charged particle producing source into a predetermined shape; and
    a design pattern transferring step of transferring a design pattern formed on a mask onto a substrate by repeating partial transfer for transferring a part of said design pattern onto said substrate by allowing said shaped beam to transmit the part of said design pattern and exposing a part of said substrate to said transmitted beam, wherein said design pattern transferring step includes, in conducting said partial transfer, a step of forming a double exposure portion that is doubly exposed in an exposure area on said substrate exposed to said beam, and exposing said exposure area so that an exposure dose in said double exposure portion and an exposure dose in a non-double exposure portion that is not doubly exposed are substantially the same.

2. The charged particle lithography method of claim 1, wherein said beam shaping step includes a step of shaping said output beam so that an exposure dose of said output beam at a center of a line extending between an end of said double exposure portion closer to said non-double exposure portion and the other end of said double exposure portion farther from said non-double exposure portion is approximately a half of an exposure dose in said non-double exposure portion, and said design pattern transferring step includes a step of scanning said shaped beam across said mask and said substrate zonally.

3. The charged particle lithography method of claim 1, wherein said beam shaping step includes a step of continuously changing said output beam so that an exposure dose of said output beam in said double exposure portion is 0 at an end thereof farther from said non-double exposure portion and is a predetermined dose at the other end closer to said non-double exposure portion, and said design pattern transferring step includes a step of scanning said shaped beam across said mask and said substrate zonally.

4. The charged particle lithography method of claim 1, wherein said beam shaping step includes a step of shaping said output beam so that an exposure dose of said output beam in said double exposure portion is approximately a half of an exposure dose in said non-double exposure portion, and said design pattern transferring step includes a step of exposing said mask and the part of said substrate to said shaped beam with said shaped beam stopped, and moving said shaped beam so as to doubly expose an end portion of said exposure area toward a direction of moving said shaped beam.

5. The charged particle lithography method of claim 4, wherein said beam shaping step includes a step of shaping said output beam so that an exposure dose of said output beam in said double exposure portion at each of four corners in said exposure area is approximately ¼ of an exposure dose in said non-double exposure portion.

6. The charged particle lithography method of claim 1, wherein said double exposure portion has a width smaller than approximately one-hundredth of a distance to move said exposure area in repeating said partial transfer.

7. The charged particle lithography method of claim 1, wherein said double exposure portion has a width smaller than approximately one-hundredth of a width of said exposure area.

8. A charged particle lithography system for writing a design pattern formed on a mask onto a substrate by repeating exposure of a part of said design pattern to a beam of charged particles with the part of said design pattern partially overlapped in each exposure, comprising:

charged particle producing means for emitting said beam to said substrate;

substrate supporting means for supporting said substrate;

mask supporting means for supporting said mask between said charged particle producing means and said substrate;

a shaping aperture for shaping said beam into a predetermined shape disposed between said charged particle producing means and said mask supported by said mask supporting means; and moving means for moving said mask supporting means and said substrate supporting means relatively to said charged particle producing means, wherein said shaping aperture has an aperture pattern for attaining substantially the same exposure dose in a double exposure portion that is doubly exposed and in a non-double exposure portion that is not doubly exposed, said double exposure portion and said non-double exposure portion being formed in an exposure area on said substrate exposed to said beam having passed through said mask.

9. The charged particle lithography system of claim 8, wherein an area of said aperture pattern corresponding to said double exposure portion has an aperture ratio of substantially 50% and an area of said aperture pattern corresponding to said non-double exposure portion has an aperture ratio of substantially 100%.

10. The charged particle lithography system of claim 9, wherein said aperture pattern is in the shape of a parallelogram having, as opposing oblique sides, sides of the area of said aperture pattern corresponding to said double exposure portion.

11. The charged particle lithography system of claim 9, wherein said aperture pattern is in the shape of a trapezoid having, as opposing oblique sides, sides of the area of said aperture pattern corresponding to said double exposure portion.

12. The charged particle lithography system of claim 8, wherein the area of said aperture pattern corresponding to said double exposure portion has transmittance of substantially 50% and the area of said aperture pattern corresponding to said non-double exposure portion has transmittance of substantially 100%.

13. The charged particle lithography system of claim 8, wherein said mask supporting means is a mask stage and said substrate supporting means is a substrate stage, and said moving means moves said mask stage and said substrate stage in synchronization with each other.

14. A charged particle lithography system for writing a design pattern formed on a mask onto a substrate by repeating exposure of a part of said design pattern to a beam of charged particles with the part of said design pattern partially overlapped in each exposure, comprising:

charged particle producing means for emitting said beam to said substrate;

substrate supporting means for supporting said substrate;

mask supporting means for supporting said mask between said charged particle producing means and said substrate; and moving means for moving said mask supporting means and said substrate supporting means relatively to said charged particle producing means, wherein said charged particle producing means includes plural charged particle sources arranged for attaining substantially the same exposure dose in a double exposure portion that is doubly exposed and in a non-double exposure portion that is not doubly exposed, said double exposure portion and said non-double exposure portion being formed in an exposure area on said substrate exposed to said beam having passed through said mask.

15. The charged particle lithography system of claim 14, wherein charged particle sources arranged in an area corresponding to said double exposure portion in said charged particle producing means have a charged particle emission energy of substantially 50% of a charged particle emission energy of charged particle sources arranged in an area corresponding to said non-double exposure portion.

16. The charged particle lithography system of claim 14, wherein the number of charged particle sources arranged in a direction of moving said beam in an area corresponding to said double exposure portion in said charged particle producing means is substantially a half of the number of charged particle sources arranged in an area corresponding to said non-double exposure portion.

17. The charged particle lithography system of claim 14, wherein said mask supporting means is a mask stage and said substrate supporting means is a substrate stage, and said moving means moves said mask stage and said substrate stage in synchronization with each other.

* * * * *